June 18, 1963 R. EMEIS 3,093,882
METHOD FOR PRODUCING A SILICON SEMICONDUCTOR DEVICE
Filed Sept. 28, 1959
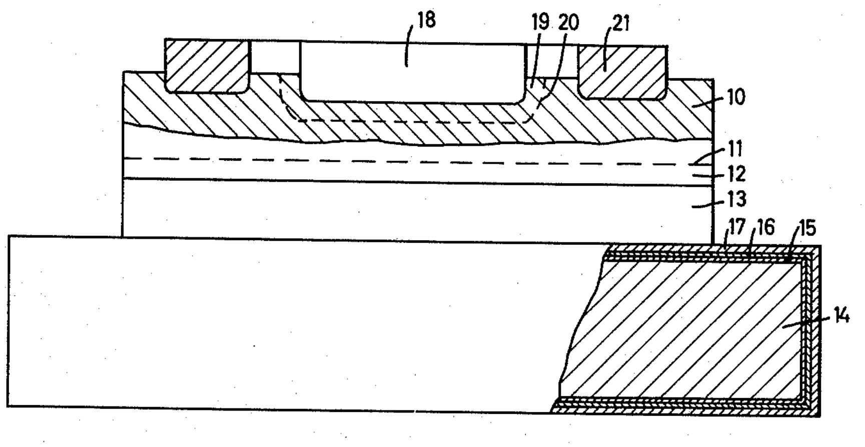

3,093,882

METHOD FOR PRODUCING A SILICON SEMICONDUCTOR DEVICE

Reimer Emeis, Ebermannstadt, Upper Franconia, Germany, assignor to Siemens-Schuckertwerke Aktiengesellschaft, Berlin, Germany, a corporation of Germany Filed Sept. 28, 1959, Ser. No. 842,775
Claims priority, application Germany Sept. 30, 1958
5 Claims. (Cl. 29—25.3)

My invention relates to a method for producing a rectifier, transistor, or other electronic semiconductor device having a disc, wafer or other plate-shaped body of silicon joined face-to-face with a carrier plate of molybdenum and carrying a plurality of electrodes of which at least one is formed by alloying a gold foil together with a surface zone of the silicon.

According to my invention, the bonding of the silicon body with the molybdenum plate is performed in at least three separate processing steps. First, the silicon plate is provided with an electrode coating consisting of a gold-silicon alloy. In a second separate step of operation, at least one flat side of the molybdenum plate is provided with a gold coating. In a third step, the gold-silicon alloy side of the silicon body and the gilded molybdenum plate are placed face-to-face upon each other and are then alloyed together by heating them to a temperature above the eutectic melting temperature of the gold-silicon alloy but not exceeding a limit of approximately 450°, thus temporarily re-melting the gold-silicon electrode and causing it to become alloyed together with the gold-coating of the molybdenum plate.

My invention is predicated upon the following considerations and objectives.

It is known to provide a silicon plate with an alloy electrode by using a gold foil containing a slight amount of doping substance, for example antimony, and alloy-bonding the gold foil together with the preferably monocrystalline and relatively weakly doped silicon body at a temperature of about 700° C. During this process, a portion of the silicon body is dissolved and a gold-silicon melt is formed. During subsequent cooling, silicon again segregates out of the melt by recrystallization and is deposited upon the original, not dissolved silicon, which then acts as a crystal seed. Atoms of the doping substance are then being built into the lattice of the recrystallizing silicon, thus producing a highly doped range resulting in the formation of a p-n junction. For example, when using a p-type silicon body with a gold foil that contains donor substance, a p-n junction is formed at the boundary area between the recrystallized silicon layer and the portion of the original silicon body that remained unchanged. In order to preserve the highest possible diffusion length in the semiconductor, an attempt must be made to operate at the lowest applicable temperatures during further thermal processing of the semiconductor device. But it has been difficult if not infeasible to produce, without considerable impairment, the desired alloy bond of the molybdenum carrier plate with the gold-containing alloy electrode of the silicon body, because among other reasons, a relatively high temperature of about 900° C. would be necessary to produce a reliable alloy bond.

It is an object of my invention to minimize or eliminate such difficulties.

To this end, and as briefly described above, the molybdenum plate or sheet is separately provided with a gold coating. The carrier plate, thus prepared, is then joined with the separately produced, gold-containing electrode of the silicon body by heat treatment at a temperature above the eutectic melting point of the gold-silicon alloy, namely at a temperature between approximately 400° C. and the above-mentioned upper limit of approximately 450° C. The temperatures within this range are just sufficient to melt the gold-silicon eutectic.

When thus proceeding, however, there is the danger that the alloying fronts may become appreciably displaced if the thickness of the gold coating on the molybdenum carrier plate exceeds a given ratio to the thickness of the dope-containing gold foil. Under unfavorable conditions, the recrystallization layer, consisting of highly doped silicon, may become completely dissolved in the melt due to the excess of gold, and a still further amount of silicon may be drawn from the previously unchanged basis range of the silicon body to enter as excess silicon into the alloy being formed. As a result, the p-n junction may be impaired or destroyed by excess of gold. This is apt to happen, for example, if a second p-n junction is present in the silicon body at a slight distance from the carrier-adjacent p-n junction, as is the case with transistors or a four-layer element (p-n-p-n), and the excess of gold is sufficient to penetrate through the intermediate basis zone. Furthermore, molybdenum or impurities that change the conductance type may penetrate from the gilded molybdenum plate into the recrystallization layer. Any molybdenum thus reaching the recrystallization layer would prevent the new formation of a recrystallization layer because it enters with gold and silicon into a ternary alloy which solidifies without segregation of silicon.

In accordance with another feature of my invention, such difficulties are excluded from the outset by giving the molybdenum plate a gold coating of such small thickness that the coating is thinner by at least one decimal order of magnitude than the gold foil used for alloying the silicon plate. The thickness of the gold coating on the molybdenum plate is preferably not more than $\frac{1}{50}$ to $\frac{1}{30}$ of the thickness of the gold foil. This has the further advantage that it becomes permissible, and does not involve any detriment or danger, to use cheaper gold of normal commercial purity as a coating for the carrier plate of molybdenum.

For better adherence of the gold, the molybdenum plate, prior to being gilded, may first be coated with a nickel layer and then with a silver layer, this being done preferably by electroplating. After each plating operation, the respective nickel and silver coatings are burned into the substratum by tempering the coated plate at about 800° C. in a neutral atmosphere, for example nitrogen, thus securely bonding the coating to the molybdenum before applying the next coating. The next following gold-plating operation is preferably also effected electrolytically. This produces a particularly intimate bond of the gold coating with the silver layer. During the subsequent heat treatment, these two layers are to a great extent converted into mixed crystals. The mixed-crystal formation already commences at approximately 200° C., and furnishes an essential contribution to the solid and fast-adhering bond of the molybdenum plate with the gold-containing alloy electrode of the silicon element due to the effect of the next following melting operation described above.

When producing the gold coating by electroplating, such coating is obtained on both sides of the molybdenum sheet, unless one of these sides is covered in the electrolytic bath. A gold coating on both sides of the plate has the advantage that the side of the molybdenum plate facing away from the silicon can subsequently be joined more readily, for example by ordinary soldering, with a metal support, cooling vane, supply terminal, or other metal structure. Furthermore, a gold coating on both sides of the plate protects the molybdenum plate from attack by the conventional etching agents which act upon silicon but not on gold, as is the case for example with a mixture of fluoric acid and nitric acid in a mixing ratio of 1:1.

An advantageous way of obtaining a good adhesion of the gold coating on the carrier plate for the purposes of the invention, is to deposit the gold coating directly upon the molybednum of the plate and to then burn the coating in by tempering at approximately 900° C., preferably in a neutral atmosphere such as nitrogen. The just-mentioned high temperature is permissible for this particular operation because the silicon element is not subjected to this step of the method which, as mentioned, is performed separately from the preparation of the silicon plate. For increasing the density of the gold coating, it is in some cases preferable to deposit it in several component layers whose individual thickness is only a fraction of the total thickness of the gold coating when completed. When thus proceeding, each component layer is burned in, as described above, immediately upon its deposition and before applying the next following layer.

For further explaining the method according to the invention, reference will be made to the drawings showing, by way of example, a semiconductor device in an intermediate processing stage just prior to applying the third method step.

The p-conducting basis range 10 of a separately manufactured silicon element, for example for use as a transistor, is first provided with electrodes in a first stage of operation by alloying onto the silicon a gold foil which contains donor substance, for example 0.5 to 1.0% of antimony. The antimony-containing recrystallization layer 12 thus formed with the silicon body borders an antimony-containing gold-silicon alloy layer 13. Located between the layers 10 and 12 is a p-n junction 11. The layers 12 and 13 thus produced form the collector electrode of the transistor.

The upper side of the transistor carries an emitter electrode of the same constitution as the collector electrode but of smaller area. The emitter consists of an alloy layer 18 and an adjacent recrystallization layer 19 which forms a second p-n junction with the basis zone 10. A basis contact 21 is also joined with the silicon plate and is produced, for example, by alloying a ring-shaped boron-containing gold foil together with the silicon. The described semiconductor element rests upon a molybdenum carrier plate 14 which is previously prepared in a second processing step by depositing thereupon a nickel layer 15, a silver layer 16, and a gold coating 17 in the above-described manner. The semiconductor element and the carrier plate are alloy-bonded to each other by subjecting the illustrated assembly to a third step of operation involving heating of the assembly to a temperature between approximately 400 and approximately 450° C., which causes the gold-silicon layer 13 to alloy and coalesce together with the gold layer 17.

I claim:

1. A method of making a semiconductor device comprising a body of silicon, a gold electrode, a p-n junction between the silicon and gold, and a carrier plate of molybdenum bonded to the gold electrode; said method comprising alloying a doped gold foil to a face of the silicon body to form said electrode and said p-n junction, the doping substance being chosen to confer the opposite conductance type of said silicon; separately gilding a surface of the molybdenum plate by depositing thereon a gold coating having a thickness not more than one-thirtieth that of said gold foil and burning the gold coating into the molybdenum plate; and thereafter alloying together the said electrode of the silicon body to the gilded surface of the molybdenum at a temperature of 400° to 450° C.

2. A method of making a semiconductor device comprising a body of silicon, a gold electrode, a p-n junction between the silicon and gold, and a carrier plate of molybdenum bonded to the electrode; said method comprising alloying a doped gold foil to a face of the silicon body to form said electrode and said p-n junction, the doping substance being chosen to confer the opposite conductance type of said silicon; separately gilding a surface of the molybdenum plate by depositing thereon a gold coating having a thickness not more than one-thirtieth that of said gold foil and burning the gold coating into the molybdenum plate; and thereafter alloying together the said electrode of the silicon body to the gilded surface of the molybdenum at a temperature of 400° to 450° C.; the gilded surface of the molybdenum carrier plate being formed by depositing gold directly upon the molybdenum plate and burning the gold into the plate at about 900° C.

3. A method of making a semiconductor device comprising a body of silicon, a gold electrode, a p-n junction between the silicon and gold, and a carrier plate of molybdenum bonded to the electrode; said method comprising alloying a doped gold foil to a face of the silicon body to form said electrode and said p-n junction, the doping substance being chosen to confer the opposite conductance type of said silicon; separately gilding a surface of the molybdenum plate by depositing thereon a gold coating having a thickness not more than one-thirtieth that of said gold foil and burning the gold coating into the molybdenum plate; and thereafter alloying together the said electrode of the silicon body to the gilded surface of the molybdenum at a temperature of 400° to 450° C., the gilded surface of the molybdenum carrier plate being formed by depositing the gold directly upon the molybdenum plate in the form of a number of component layers, each of which is burned into the molybdenum plate at about 900° C. before applying the next layer.

4. A method of making a silicon electric semi-conductor device having a molybdenum carrier plate, comprising heating a silicon body in face-to-face contact with a gold foil containing doping substance, to dissolve a portion of the silicon body and form a gold-silicon melt, and then cooling to form a gold-silicon alloy on the silicon body and to segregate recrystallized silicon out of the melt and to deposit the recrystallized silicon upon the undissolved part of the silicon body, the recrystallized silicon containing said doping substance, the doping substance being chosen to confer the opposite conductance type of said silicon, thus producing a gold-silicon alloy electrode on the silicon body and a p-n junction between the silicon body and the said electrode, joining the molybdenum carrier plate to said gold-silicon alloy electrode by separately joining gold to the carrier plate to provide a gilded surface thereon, and thereafter joining said gilded surface to the fold-silicon alloy electrode by heating them in face-to-face contact to a temperature of 400° to 450° C., to temporarily melt the gold-silicon alloy and to alloy-bond the gold surface of the carrier plate to the body, the gold coating of the carrier plate having a thickness not more than one-thirtieth that of the gold foil used for alloying to the silicon body, the gilded surface of the molybdenum plate being formed by electrode-depositing the gold directly upon the molybdenum plate, and burning said gold into the surface of the molybdenum.

5. The method defined in claim 4, the gilded surface of the molybdenum being formed by electrode-depositing the gold directly upon the molybdenum in the form of a number of component layers, each of which is burned into the molybdenum plate at about 900° C., before applying the next layer.

References Cited in the file of this patent

UNITED STATES PATENTS

| | | |
|---|---|---|
| 2,798,013 | Irmler | July 2, 1957 |
| 2,854,612 | Zaratkiewicz | Sept. 30, 1958 |
| 2,863,105 | Ross | Dec. 2, 1958 |